(12) United States Patent
Kishioka et al.

(10) Patent No.: US 8,993,699 B2
(45) Date of Patent: Mar. 31, 2015

(54) PHOTOSENSITIVE RESIN COMPOSITION FOR MICROLENS

(75) Inventors: Takahiro Kishioka, Toyama (JP); Takahiro Sakaguchi, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 559 days.

(21) Appl. No.: 13/391,761

(22) PCT Filed: Jun. 21, 2010

(86) PCT No.: PCT/JP2010/060476
§ 371 (c)(1),
(2), (4) Date: Feb. 22, 2012

(87) PCT Pub. No.: WO2011/024545
PCT Pub. Date: Mar. 3, 2011

(65) Prior Publication Data
US 2012/0156598 A1 Jun. 21, 2012

(30) Foreign Application Priority Data
Aug. 24, 2009 (JP) .................................. 2009-193108

(51) Int. Cl.
| | |
|---|---|
| *G03F 7/004* | (2006.01) |
| *G02B 1/04* | (2006.01) |
| *C08F 26/06* | (2006.01) |
| *G03F 7/00* | (2006.01) |
| *G03F 7/023* | (2006.01) |
| *G03F 7/40* | (2006.01) |

(52) U.S. Cl.
CPC ................ *C08F 26/06* (2013.01); *G02B 1/043* (2013.01); *G03F 7/0005* (2013.01); *G03F 7/0233* (2013.01); *G03F 7/40* (2013.01)
USPC ................... 526/262; 430/8; 430/18

(58) Field of Classification Search
CPC ................ C08F 212/32; C08F 222/40; C08F 216/1416; C08F 212/14; G03F 7/0233; G03F 7/0007; G03F 7/038; G03F 7/022; G03F 7/004; G02B 1/041; G02B 1/04
USPC .......................................... 526/626; 430/8, 18
See application file for complete search history.

(56) References Cited

U.S. PATENT DOCUMENTS

| | | |
|---|---|---|
| 6,586,560 B1 | 7/2003 | Chen et al. |
| 2010/0081070 A1* | 4/2010 | Taguchi ............................ 430/7 |
| 2010/0096663 A1* | 4/2010 | Negi et al. ..................... 257/100 |

FOREIGN PATENT DOCUMENTS

| | | | | |
|---|---|---|---|---|
| JP | B2-6-023842 | 3/1994 | | |
| JP | A-2001-354822 | 12/2001 | | |
| JP | A-2002-323771 | 11/2002 | | |
| JP | A-2002-341137 | 11/2002 | | |
| JP | A-2003-026942 | 1/2003 | | |
| JP | 2003131375 A | * 5/2003 | ............. | G03F 7/032 |
| JP | A-2003-131375 | 5/2003 | | |
| JP | A-2004-224894 | 8/2004 | | |
| JP | A-2008-303315 | 12/2008 | | |
| JP | A-2009-003366 | 1/2009 | | |
| JP | A-2009-157038 | 7/2009 | | |
| JP | A-2009-179770 | 8/2009 | | |
| WO | WO 02/083764 A1 | 10/2002 | | |
| WO | WO 2005/116764 A1 | 12/2005 | | |
| WO | WO 2008143095 A1 | * 11/2008 | | |

OTHER PUBLICATIONS

Extended Search Report issued in European Patent Application No. 10811596.5 dated Jun. 30, 2014.
Jul. 20, 2010 International Search Report issued in PCT/JP2010/060476, Japanese Patent Office.
Jul. 20, 2010 Written Opinion of the International Searching Authority issued in PCT/JP2010/060476 (English translation).

* cited by examiner

*Primary Examiner* — Ling Choi
*Assistant Examiner* — Chun-Cheng Wang
(74) *Attorney, Agent, or Firm* — Oliff PLC

(57) ABSTRACT

There is provided a photosensitive resin composition for a microlens. A photosensitive resin composition for a microlens, comprising a component (A), a component (B) and a component (C), wherein the component (A) is a polymer having a maleimide structural unit of Formula (1), the component (B) is a cross-linking agent, and the component (C) is a photosensitizing agent.

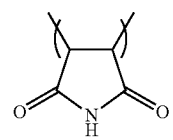

(1)

4 Claims, No Drawings

PHOTOSENSITIVE RESIN COMPOSITION FOR MICROLENS

TECHNICAL FIELD

The present invention relates to a photosensitive resin composition for a microlens. More specifically, the present invention relates to a photosensitive resin composition for a microlens that can remarkably improve transparency, heat resistance, heat discoloration resistance, and solvent resistance.

BACKGROUND ART

A conventionally known material for forming microlenses is polyhydroxystyrene. However, the material has problems as below and there has been room for improvement. When polyhydroxystyrene is used as a material for forming a microlens, the microlens is likely to have a deformed hemispherical shape due to heating at a high temperature, and thus it is difficult to form a microlens having a stable shape. Furthermore, polyhydroxystyrene is likely to be colored by heat treatment and tends to have reduced transparency, and hence the discoloration may be observed during use of the microlens.

Meanwhile, there are disclosed a photoresist composition, a composition for forming an anti-reflective coating, a material for forming a resist protective film for immersion lithography, and the like that contain a maleimide copolymer (Patent Documents 1 to 4).

In order to develop an insulating film for display devices such as a liquid crystal display (LCD) and an organic electroluminescent display device, there is disclosed a method for forming an insulating film for a display device characterized by using a radiation-sensitive resin composition that contains an alkali-soluble copolymer composed of indene, maleimide, and an N-substituted maleimide, a 1,2-naphthoquinone diazide compound, and a cross-linking agent (Patent Document 5).

In order to be suitably used for various applications that require characteristics of excellent compatibility with a polyfunctional (meth)acrylate and good alkali-solubility, there is disclosed a maleimide copolymer characterized by including a monomer structural unit derived from unsubstituted maleimides, a monomer structural unit derived from styrenes, and a monomer structural unit derived from (meth)acrylic acids (Patent Document 6).

However, these related art documents do not intend to provide applications as a photosensitive resin composition for a microlens as well as do not suggest specific means and effects of the application of an unsubstituted maleimide or a copolymer including unsubstituted maleimide and N-substituted maleimide unit structures to a photosensitive resin composition for a microlens.

There is also disclosed a radiation-sensitive resin composition characterized by including [A] a polymer of (a1) an unsaturated carboxylic acid and/or an unsaturated carboxylic acid anhydride, (a2) an epoxy group-containing unsaturated compound, (a3) a maleimide monomer, and (a4) another olefinic unsaturated compound and [B] a 1,2-quinonediazide compound (Patent Document 7). The document describes that the disclosed radiation-sensitive resin composition can achieve high radiation sensitivity and can easily form a patterned thin film excellent in solvent resistance, heat resistance, transparency, and heat discoloration resistance. However, the document does not suggest the shape and the heat resistance of a pattern formed from the composition. Furthermore, the document does not describe an unsubstituted maleimide as the maleimide monomer.

RELATED ART DOCUMENTS

Patent Documents

Patent Document 1: U.S. Pat. No. 6,586,560 (B1) specification
Patent Document 2: Japanese Patent Application Publication No. JP-B-6-23842
Patent Document 3: Japanese Patent Application Publication No. JP-A-2008-303315
Patent Document 4: Japanese Patent Application Publication No. JP-A-2002-323771
Patent Document 5: Japanese Patent Application Publication No. JP-A-2003-131375
Patent Document 6: Japanese Patent Application Publication No. JP-A-2004-224894
Patent Document 7: Japanese Patent Application Publication No. JP-A-2001-354822

SUMMARY OF THE INVENTION

Problem to be Solved by the Invention

In view of the above, it is an object of the present invention to provide a photosensitive resin composition for a microlens that can remarkably improve transparency, heat resistance, heat discoloration resistance, solvent resistance, and patterning properties.

Means for Solving the Problem

The present inventors have carried out intensive studies in order to solve the problems and, as a result, have completed the present invention.

That is, as a first aspect,
a photosensitive resin composition for a microlens includes a component (A), a component (B), and a component (C), in which
the component (A) is a polymer having a maleimide structural unit of Formula (1),
the component (B) is a cross-linking agent, and
the component (C) is a photosensitizing agent.

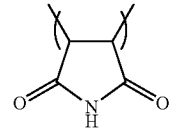

(1)

As a second aspect, in the photosensitive resin composition for a microlens according to the first aspect, the component (A) is a copolymer including at least one N-substituted maleimide structural unit of Formula (2) in addition to the maleimide structural unit of Formula (1):

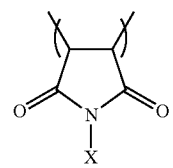

(2)

(where X is a $C_{1-5}$ alkyl group, a $C_5$ or $C_6$ cycloalkyl group, a phenyl group, or a benzyl group, with the proviso that some or all of hydrogen atoms of the alkyl group, the cycloalkyl group, the phenyl group, and the benzyl group are optionally substituted by a halogen atom, a carboxy group, a hydroxy group, an amino group, or a nitro group).

As a third aspect, in the photosensitive resin composition for a microlens according to the first aspect or the second aspect, the component (A) is a copolymer further including at least one of structural units of Formula (3), Formula (4), or Formula (5):

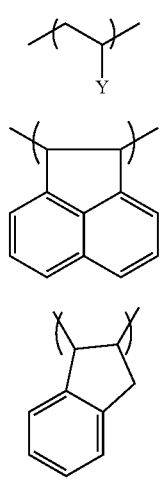

(3)

(4)

(5)

(where Y is a phenyl group, a naphthyl group, an anthracenyl group, a biphenylyl group, a carbazole group, or a $C_{1-8}$ alkoxy group, with the proviso that some or all of hydrogen atoms of the phenyl group, the naphthyl group, the anthracenyl group, the biphenylyl group, and the carbazole group are optionally substituted by a $C_{1-10}$ alkyl group, a $C_5$ or $C_6$ cycloalkyl group, a halogen atom, a carboxy group, a hydroxy group, an amino group, or a nitro group).

As a fourth aspect, in the photosensitive resin composition for a microlens according to any one of the first aspect to the third aspect, the polymer has a weight-average molecular weight of 1,000 to 30,000.

As a fifth aspect, a cured film is obtained from the photosensitive resin composition for a microlens as described in any one of the first aspect to the fourth aspect.

As a sixth aspect, a microlens is produced from the photosensitive resin composition for a microlens as described in any one of the first aspect to the fourth aspect.

Effects of the Invention

A film formed from the photosensitive resin composition for a microlens of the present invention can have excellent transparency, heat resistance, heat discoloration resistance, and solvent resistance.

A pattern formed from the photosensitive resin composition for a microlens of the present invention can also have excellent heat resistance.

The change of the type of N-substituted maleimide that is included in the photosensitive resin composition for a microlens of the present invention can form various microlenses, which have different refractive indexes, from the composition.

Consequently, a film formed from the photosensitive resin composition for a microlens of the present invention can remarkably reduce the possibility of discoloration of the microlens and of deformation of the lens shape when heat treatment is performed at a high temperature in a forming process of the microlens or forming processes of peripheral devices such as wiring. Furthermore, when an electrode or wiring forming process is performed after the microlens formation, troubles such as deformation and exfoliation of the microlens due to an organic solvent can be also reduced remarkably.

Therefore, the photosensitive resin composition for a microlens of the present invention is suited for a material for forming microlens.

MODES FOR CARRYING OUT THE INVENTION

The present invention is a photosensitive resin composition for a microlens that includes a component (A) of a polymer having a maleimide structural unit, a component (B) of a cross-linking agent, and a component (C) of a photosensitizing agent.

Each component will be described below in detail.

In the photosensitive resin composition for a microlens of the present invention, a solid content except for a solvent is typically 1 to 50% by mass.

<Component (A)>

The component (A) of the present invention is a polymer having at least a maleimide structural unit of Formula (1).

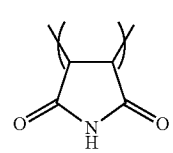

(1)

The component (A) of the present invention may be a copolymer having one or more N-substituted maleimide structural unit(s) of Formula (2) as a structural unit other than the maleimide structural unit of Formula (1).

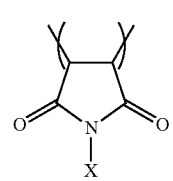

(2)

(In the formula, X is a $C_{1-5}$ alkyl group, a $C_5$ or $C_6$ cycloalkyl group, a phenyl group, or a benzyl group, with the proviso that some or all of hydrogen atoms of the alkyl group, the cycloalkyl group, the phenyl group, and the benzyl group may be substituted by a halogen atom, a carboxy group, a hydroxy group, an amino group, or a nitro group).

The component (A) of the present invention may also be a copolymer having one or more of structural units of Formula (3), Formula (4), or Formula (5) in place of the structural unit of Formula (2) or in addition to the structural unit of Formula (2) as a structural unit other than the structural unit of Formula (1).

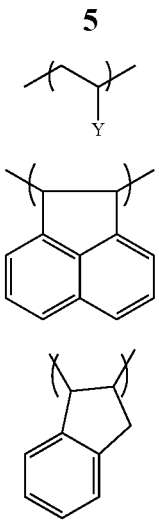

(3)

(4)

(5)

(In the formulae, Y is a phenyl group, a naphthyl group, an anthracenyl group, a biphenylyl group, a carbazole group, or a $C_{1-8}$ alkoxy group, with the proviso that some or all of hydrogen atoms of the phenyl group, the naphthyl group, the anthracenyl group, the biphenylyl group, and the carbazole group may be substituted by a $C_{1-10}$ alkyl group, a $C_5$ or $C_6$ cycloalkyl group, a halogen atom, a carboxy group, a hydroxy group, an amino group, or a nitro group).

Here, when the polymer of the component (A) is a copolymer having the structural unit(s) of Formula (2) and/or Formula (3) in addition to the structural unit of Formula (1), the molar ratio of Formula (1) and Formula (2) and/or Formula (3) is typically 10 to 90:90 to 10 and preferably 20 to 70:80 to 30. In the copolymer as the component (A), the alkyl group may be a branched alkyl group or a linear alkyl group, and examples of the branched alkyl group include a tert-butyl group.

The polymer typically has a weight-average molecular weight of 1,000 to 30,000 and preferably 1,500 to 20,000. The weight-average molecular weight is a value obtained by gel permeation chromatography (GPC) using polystyrene as a standard sample.

The photosensitive resin composition for a microlens of the present invention typically contains the component (A) in a content of 1 to 99% by mass and preferably 10 to 95% by mass based on the content in the solid content of the photosensitive resin composition for a microlens.

In the present invention, the method for obtaining a polymer having the maleimide structural unit of Formula (1) and one or more of the N-substituted maleimide structural units of Formula (2) or for obtaining a polymer having the maleimide structural unit of Formula (1) and one or more of the structural units of Formula (3), Formula (4), and Formula (5) is not specifically limited, but generally, such a polymer can be obtained by polymerization reaction of a monomer mixture containing monomers that are used for obtaining the polymer in a polymerization solvent commonly at a temperature of 50 to 110° C.

<Component (B)>

The cross-linking agent as the component (B) of the present invention is a compound that forms a bond with a formulated composition such as a resin or with another cross-linking agent molecule by the action of heat or acid. Examples of the cross-linking agent include a polyfunctional (meth)acrylate compound, an epoxy compound, a hydroxymethyl group-substituted phenol compound, and a compound having an alkoxyalkylated amino group.

These cross-linking agents may be used alone or in combination of two or more of them.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl) isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, and bis(2-hydroxyethyl) isocyanurate di(meth)acrylate.

Examples of the epoxy compound include a novolac epoxy resin, a bisphenol epoxy resin, an alicyclic epoxy resin, and an aliphatic epoxy resin.

Examples of the hydroxymethyl group-substituted phenol compound include 2-hydroxymethyl-4,6-dimethylphenol, 1,3,5-trihydroxymethylbenzene, and 3,5-dihydroxymethyl-4-methoxytoluene[2,6-bis(hydroxymethyl)-p-cresol].

The compound having an alkoxyalkylated amino group is exemplified by a nitrogen-containing compound having a plurality of active methylol groups in the molecule in which at least one hydrogen atom of the hydroxy groups in the methylol groups is substituted by an alkyl group such as a methyl group and a butyl group, and examples of the nitrogen-containing compound include (poly)methylolated melamine, (poly)methylolated glycoluril, (poly)methylolated benzoguanamine, and (poly)methylolated urea.

The compound having an alkoxyalkylated amino group may be a mixture of a plurality of substituted compounds, and the mixture may include some oligomer components formed by self-condensation. Such a mixture can be used. More specific examples include CYMEL series products such as hexamethoxymethylmelamine ("CYMEL (registered trademark) 303" manufactured by Nihon Cytec Industries Inc.), tetrabutoxymethylglycoluril ("CYMEL (registered trademark) 1170" manufactured by Nihon Cytec Industries Inc.), and tetramethoxymethylbenzoguanamine ("CYMEL (registered trademark) 1123" manufactured by Nihon Cytec Industries Inc.); and Nikalac series products such as methylated melamine resins ("Nikalac (registered trademark) MW-30HM", "Nikalac (registered trademark) MW-390", "Nikalac (registered trademark) MW-100LM", and "Nikalac (registered trademark) MX-750LM" manufactured by SANWA Chemical Co., Ltd.) and methylated urea resins ("Nikalac (registered trademark) MX-270", "Nikalac (registered trademark) MX-280", and "Nikalac (registered trademark) MX-290" manufactured by SANWA Chemical Co., Ltd.).

Among the compounds having an alkoxyalkylated amino group, hexamethoxymethylmelamine of Formula (6) is preferred.

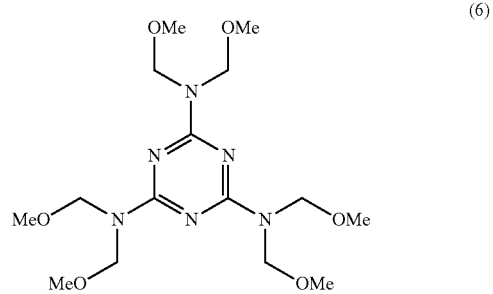 [SMILES: COCN(COC)c1nc(N(COC)COC)nc(N(COC)COC)n1]

(6)

The photosensitive resin composition for a microlens of the present invention typically contains the component (B) in a content of 1 to 50% by mass based on the content in the solid content of the photosensitive resin composition for a microlens.

<Component (C)>

The photosensitizing agent as the component (C) of the present invention is not specifically limited as long as the photosensitizing agent is a compound that can be used as a photosensitizing component, and a 1,2-naphthoquinone diazide compound is preferred.

As the 1,2-naphthoquinone diazide compound, a compound having a hydroxy group in which 10 to 100% by mol and preferably 20 to 95% by mol of the hydroxy groups are 1,2-naphthoquinone diazide sulfonated may be used.

Examples of the compound having a hydroxy group include phenol compounds such as phenol, o-cresol, m-cresol, p-cresol, hydroquinone, resorcinol, catechol, methyl gallate, ethyl gallate, 1,3,3-tris(4-hydroxyphenyl)butane, 4,4'-isopropylidene diphenol, 2,2-bis(4-hydroxyphenyl)propane, 1,1-bis(4-hydroxyphenyl)cyclohexane, 4,4'-dihydroxyphenyl sulfone, 4,4-hexafluoroisopropylidene diphenol, 4,4',4"-trishydroxyphenylethane, 1,1,1-trishydroxyphenylethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, 2,2',3,4,4'-pentahydroxybenzophenone, and 2,5-bis(2-hydroxy-5-methylbenzyl)methyl; and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate.

These photosensitizing agents may be used alone or in combination of two or more of them.

The photosensitive resin composition for a microlens of the present invention typically contains the component (C) in a content of 1 to 50% by mass based on the content in the solid content of the photosensitive resin composition for a microlens.

The preparation method of the composition for forming a microlens of the present invention is not specifically limited, but examples of the method include a method of dissolving a polymer as the component (A) in a solvent and mixing in, to the solution, a cross-linking agent as the component (B) and a photosensitizing agent as the component (C) at a predetermined ratio to prepare a homogeneous solution. Other examples of the method include a method of further adding and mixing another additive, as necessary, at an appropriate step in the preparation method above.

The solvent is not specifically limited as long as the component (A) to the component (C) can be dissolved.

Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, and γ-butyrolactone.

These solvents may be used alone or in combination of two or more of them.

Among these solvents, in order to improve leveling properties of a coated film, propylene glycol monomethyl ether, propylene glycol monomethyl ether acetate, 2-heptanone, ethyl lactate, butyl lactate, and cyclohexanone are preferred.

The composition for forming a microlens of the present invention may contain a surfactant in order to improve coating properties.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including EFTOP (registered trademark) EF301, EF303, and EF352 (manufactured by Mitsubishi Materials Electronic Chemicals Co., Ltd. (formerly Jemco Inc.)), MEGAFAC (registered trademark) F171, F173, and R30 (manufactured by DIC Corporation (formerly Dainippon Ink and Chemicals, Inc.)), Fluorad FC430 and FC431 (manufactured by Sumitomo 3M Ltd.), and AsahiGuard (registered trademark) AG710 and Surflon S-382, SC101, SC102, SC103, SC104, SC105, and SC106 (manufactured by Asahi Glass Co., Ltd.); and an organosiloxane polymer KP341 (manufactured by Shin-Etsu Chemical Co., Ltd.).

The surfactants may be used alone or in combination of two or more of them.

When the surfactant is used, the composition for forming a microlens of the present invention contains the surfactant in a content of 3% by mass or less, preferably 1% by mass or less, and more preferably 0.5% by mass or less, based on the content in the solid content of the composition for forming a microlens.

The resin composition for a microlens of the present invention may contain additives such as a curing auxiliary agent, an ultraviolet absorber, a sensitizer, a plasticizer, an antioxidant, and a bonding auxiliary agent, as necessary, as long as such an additive does not interfere with the effect of the invention.

The use of the photosensitive resin composition for a microlens of the present invention will be described below.

On a substrate {for example, a semiconductor substrate such as silicon coated with a silicon oxide coating, a semiconductor substrate such as silicon coated with a silicon nitride coating or a silicon oxide nitride coating, a silicon nitride substrate, a quartz substrate, a glass substrate (including non-alkali glass, low-alkali glass, and crystallized glass), and a glass substrate formed with an ITO film}, the photosensitive resin composition for a microlens of the present invention is applied by an appropriate coating method such as a spinner and a coater, and then is pre-baked using heating means such as a hot plate to form a coating film.

The pre-baking condition is properly selected from a baking temperature of 80 to 250° C. and a baking period of 0.3 to 60 minutes and is preferably a baking temperature of 80 to 150° C. and a baking period of 0.5 to 5 minutes.

A film formed from the composition for forming a microlens of the present invention has a film thickness of 0.005 to 3.0 μm and preferably 0.01 to 1.0 μm.

Next, on the film obtained above, exposure is performed through a mask (reticle) for forming a predetermined pattern.

The exposure may use ultraviolet rays such as g-rays and i-rays and far-infrared rays such as a KrF excimer laser. After the exposure, as necessary, post exposure bake is performed. The post exposure bake condition is properly selected from a heating temperature of 80 to 150° C. and a heating period of 0.3 to 60 minutes. Then, the film is developed with an alkali developer.

Examples of the alkaline developer include alkaline aqueous solutions including an aqueous solution of an alkali metal hydroxide such as potassium hydroxide and sodium hydroxide; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine.

Such a developer may include a surfactant and the like.

The development condition is properly selected from a development temperature of 5 to 50° C. and a development period of 10 to 300 seconds. A film formed from the composition for forming a microlens of the present invention can be readily developed using an aqueous tetramethylammonium hydroxide solution at room temperature. After the development, the film is rinsed using ultrapure water and the like.

Furthermore, the whole area of the substrate is exposed with ultraviolet rays such as g-rays and i-rays, a KrF excimer laser, or the like. Then, post-baking is performed using heating means such as a hot plate. The post-baking condition is properly selected from a baking temperature of 100 to 250° C. and a baking period of 0.5 to 60 minutes.

EXAMPLES

Hereinafter, the present invention will be described in further detail based on examples and comparative examples, but the present invention is not limited to these examples.

[Measurement of Weight Average Molecular Weight of Polymer Obtained in Synthesis Example Below]

Apparatus: GPC system manufactured by JASCO Corporation

Column: Shodex [registered trademark] KL-804L and 803L

Column oven: 40° C.

Flow rate: 1 mL/min

Eluant: tetrahydrofuran

[Synthesis of Polymer]

Synthesis Example 1

In 47.1 g of 2-butanone, 9.6 g of maleimide, 20 g of N-cyclohexylmaleimide, and 1.8 g of dimethyl 2,2'-azobis(isobutyrate) were dissolved, and then the solution was added dropwise over 4 hours into a flask in which 78.5 g of 2-butanone was heated and refluxed. After the completion of the dropwise addition, the whole was reacted for 4 hours. After cooling the reaction solution to room temperature, the solution was poured into a hexane/diethyl ether mixed solvent to reprecipitate a polymer, and the precipitate was dried under reduced pressure to provide a polymer (copolymer) having a structural unit of Formula (7).

The obtained polymer had a weight-average molecular weight Mw of 10,400 (in terms of polystyrene).

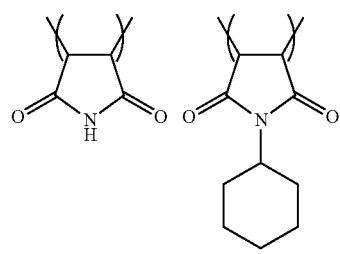

(7)

Synthesis Example 2

In 35.7 g of 2-butanone, 7.5 g of maleimide, 15 g of N-phenylmaleimide, and 1.4 g of dimethyl 2,2'-azobis(isobutyrate) were dissolved, and then the solution was added dropwise over 2 hours into a flask in which 59.5 g of 2-butanone was heated and refluxed. After the completion of the dropwise addition, the whole was reacted for 2 hours. After cooling the reaction solution to room temperature, the solution was poured into a hexane/diethyl ether mixed solvent to reprecipitate a polymer, and the precipitate was dried under reduced pressure to provide a polymer (copolymer) having a structural unit of Formula (8).

The obtained polymer had a weight-average molecular weight Mw of 8,200 (in terms of polystyrene).

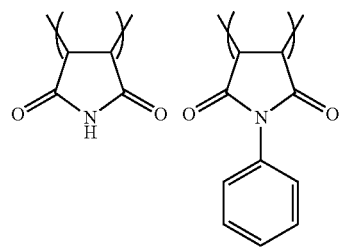

(8)

Synthesis Example 3

In 31.3 g of 2-butanone, 4.7 g of maleimide, 15 g of N-2,4,6-trichlorophenylmaleimide, and 1.2 g of dimethyl 2,2'-azobis(isobutyrate) were dissolved, and then the solution was added dropwise over 2 hours into a flask in which 52.1 g of 2-butanone was heated and refluxed. After the completion of the dropwise addition, the whole was reacted for 3 hours. After cooling the reaction solution to room temperature, the solution was poured into a hexane/diethyl ether mixed solvent to reprecipitate a polymer, and the precipitate was dried under reduced pressure to provide a polymer (copolymer) having a structural unit of Formula (9).

The obtained polymer had a weight-average molecular weight Mw of 3,000 (in terms of polystyrene).

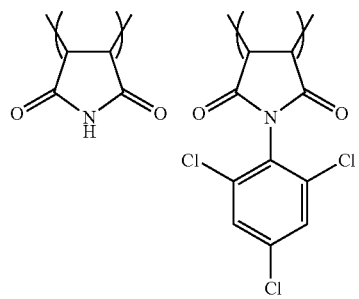

(9)

Synthesis Example 4

In 34.8 g of 2-butanone, 6.9 g of maleimide, 15 g of N-benzylmaleimide, and 1.3 g of dimethyl 2,2'-azobis(isobutyrate) were dissolved, and then the solution was added dropwise over 2 hours into a flask in which 58.0 g of 2-butanone was heated and refluxed. After the completion of the dropwise addition, the whole was reacted for 3 hours. After cooling the reaction solution to room temperature, the solution was poured into a hexane/diethyl ether mixed solvent to reprecipitate a polymer, and the precipitate was dried under reduced pressure to provide a polymer (copolymer) having a structural unit of Formula (10).

The obtained polymer had a weight-average molecular weight Mw of 5,600 (in terms of polystyrene).

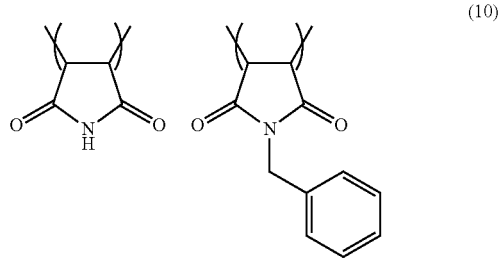

(10)

Synthesis Example 5

In 36.2 g of 2-butanone, 9 g of maleimide, 10 g of N-cyclohexylmaleimide, 3.7 g of n-butyl vinyl ether, and 1.4 g of dimethyl 2,2'-azobis(isobutyrate) were dissolved, and then the solution was added dropwise over 2 hours into a flask in which 60.3 g of 2-butanone was heated and refluxed. After the completion of the dropwise addition, the whole was reacted for 3 hours. After cooling the reaction solution to room temperature, the solution was poured into a hexane/diethyl ether mixed solvent to reprecipitate a polymer, and the precipitate was dried under reduced pressure to provide a polymer (copolymer) having a structural unit of Formula (11).

The obtained polymer had a weight-average molecular weight Mw of 5,800 (in terms of polystyrene).

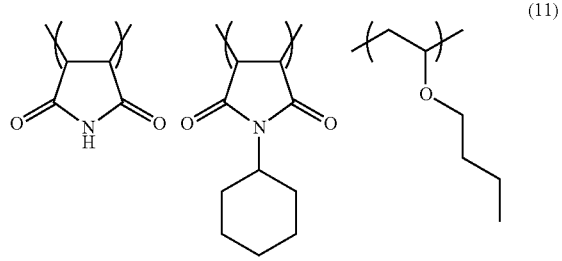

(11)

Synthesis Example 6

In 108 g of propylene glycol monomethyl ether, 17 g of maleimide, 27 g of 2-vinylnaphthalene, and 2.2 g of 2,2'-azobisisobutyronitrile were dissolved, and then the solution was added dropwise over 2 hours into 30 g of propylene glycol monomethyl ether that was heated to be kept at 80° C. under a nitrogen atmosphere. After the completion of the dropwise addition, the whole was reacted at 80° C. for 20 hours. After cooling the reaction solution to room temperature, the solution was poured into methanol to reprecipitate a polymer, and the precipitate was dried under reduced pressure to provide a polymer (copolymer) having a structural unit of Formula (12).

The obtained polymer had a weight-average molecular weight Mw of 7,300 (in terms of polystyrene).

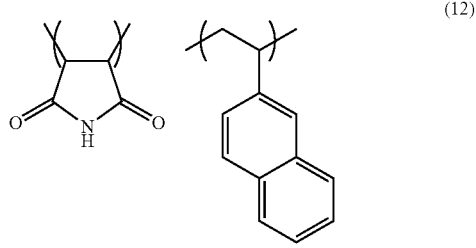

(12)

[Preparation of Photosensitive Resin Composition Solution]

Examples 1 to 5

In 32.9 g of propylene glycol monomethyl ether and 32.9 g of propylene glycol monomethyl ether acetate, 9 g of each polymer obtained in Synthesis Examples 1 to 5 as the component (A), 2.7 g of CYMEL (registered trademark) 303 (Nihon Cytec Industries Inc.) as the cross-linking agent that was the component (B), 2.7 g of P-150 (manufactured by Toyo Gosei Co., Ltd.) as the photosensitizing agent that was the component (C), and 0.04 g of MEGAFAC (registered trademark) R-30 (manufactured by DIC Corporation) as the surfactant were dissolved to prepare a solution. Then, the solution was filtered using a polyethylene microfilter having a pore size of 0.10 μm to prepare a photosensitive resin composition solution.

Example 6

In 46.0 g of propylene glycol monomethyl ether and 19.7 g of ethyl lactate, 9 g of the polymer obtained in Synthesis Example 6 as the component (A), 2.7 g of CYMEL (registered trademark) 303 (Nihon Cytec Industries Inc.) as the cross-linking agent that was the component (B), 2.7 g of P-200 (manufactured by Toyo Gosei Co., Ltd.) as the photosensitizing agent that was the component (C), 0.03 g of MEGAFAC (registered trademark) R-30 (manufactured by DIC Corporation) as the surfactant were dissolved to prepare a solution. Then, the solution was filtered using a polyethylene microfilter having a pore size of 0.10 μm to prepare a photosensitive resin composition solution.

Comparative Example 1

In 46.0 g of propylene glycol monomethyl ether and 19.7 g of ethyl lactate, 9 g of poly(4-vinylphenol) of Formula (13) (manufactured by Sigma-Aldrich Japan K.K., a weight-average molecular weight Mw of 20,000), 2.7 g of P-200 (manufactured by Toyo Gosei Co., Ltd.) as the photosensitizing agent, 2.7 g of CYMEL (registered trademark) 303 (Nihon Cytec Industries Inc.) as the cross-linking agent, and 0.03 g of MEGAFAC (registered trademark) R-30 (manufactured by DIC Corporation) as the surfactant were dissolved to prepare a solution. Then, the solution was filtered using a polyethylene microfilter having a pore size of 0.10 µm to prepare a photosensitive resin composition solution.

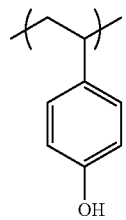

(13)

[Measurement of Transmittance]

Each photosensitive resin composition solution prepared in Examples 1 to 6 and Comparative Example 1 was applied on a quartz substrate using a spin coater and pre-baked on a hot plate at 100° C. for 2 minutes. Then, the whole area was irradiated with ultraviolet rays having an irradiation amount of 500 mJ/cm$^2$ at 365 nm using an ultraviolet irradiation apparatus PLA-501 (F) (manufactured by Canon Inc.) (photobleaching). Then, the substrate was post-baked on a hot plate at 200° C. for 5 minutes to form a film having a film thickness of 1 µm. The transmittance at a wavelength of 400 nm of the film was determined using an ultraviolet-visible spectrophotometer UV-2550 (manufactured by Shimadzu Corporation). The film was further heated at 260° C. for 3 minutes, and then the transmittance at a wavelength of 400 nm was determined. The evaluation results are shown in Table 1.

TABLE 1

|  | Transmittance (400 nm) | |
| --- | --- | --- |
|  | 200° C. | 260° C. |
| Example 1 | 97 | 96 |
| Example 2 | 95 | 97 |
| Example 3 | 96 | 98 |
| Example 4 | 96 | 94 |
| Example 5 | 95 | 95 |
| Example 6 | 95 | 92 |
| Comparative Example 1 | 95 | 78 |

From the results in Table 1, each film formed from the photosensitive resin composition of the present invention had high heat resistance and hardly discolored after the heating at 260° C. In contrast, the film of Comparative Example 1 had a transmittance of 95% after the post-bake at 200° C. for 5 minutes, but the transmittance of the film was reduced to 78% after further heating at 260° C. for 3 minutes.

[Patterning Test]

Each photosensitive resin composition solution prepared in Examples 1 to 6 and Comparative Example 1 was applied on a silicon wafer using a spin coater and pre-baked on a hot plate at 100° C. for 2 minutes to form a photosensitive resin film having a film thickness of 1 µm. Then, the film was exposed using an i-ray stepper NSR-2205i12D (NA=0.63) (manufactured by NIKON CORPORATION) through a mask. Then, the post exposure bake (PEB) was carried out on a hot plate at 100° C. for 2 minutes. The film was developed with an aqueous TMAH solution (0.2% by mass for Examples 1 to 5 and 1.0% by mass for Example 6 and Comparative Example 1) for 60 seconds, then rinsed with ultra-pure water for 20 seconds, and dried to form a dot pattern having a size of 2 µm×2 µm. Next, the whole area was irradiated with i-rays at 500 mJ/cm$^2$ using the i-rays stepper (photobleaching), and post-baked on a hot plate at 200° C. for 5 minutes. Then, the film was heated at 260° C. for 3 minutes. Using a scanning electron microscope S-4800 (manufactured by Hitachi High-Technologies Corporation), each pattern was observed after the development, rinse, and drying, after the post-bake at 200° C., and after the heating at 260° C. The evaluation results are shown in Table 2.

TABLE 2

|  | Pattern shape | |
| --- | --- | --- |
|  | 200° C. | 260° C. |
| Example 1 | ○ | ○ |
| Example 2 | ○ | ○ |
| Example 3 | ○ | ○ |
| Example 4 | ○ | ○ |
| Example 5 | ○ | ○ |
| Example 6 | ○ | ○ |
| Comparative Example 1 | × | × |

In Table 2, after the post-bake at 200° C. and after the heating at 260° C., the pattern that maintained the pattern shape after the development, rinse, and drying is represented by "○", while the pattern that did not maintain the pattern shape due to reflow is represented by "×".

From the results in Table 2, the pattern formed using the photosensitive resin composition of the present invention had high heat resistance and did not cause pattern reflow in each condition at 200° C. and 260° C.

[Dissolution Test into Photoresist Solvent]

Each photosensitive resin composition solution prepared in Examples 1 to 6 and Comparative Example 1 was applied on a silicon wafer using a spin coater, and pre-baked on a hot plate at 100° C. for 2 minutes. Next, the whole area was irradiated with ultraviolet rays having an irradiation amount of 500 mJ/cm$^2$ at 365 nm using an ultraviolet irradiation apparatus PLA-501 (F) (manufactured by Canon Inc.) (photobleaching). Then, the substrate was post-baked on a hot plate at 200° C. for 5 minutes to form a film having a film thickness of 1 µm. The film was immersed in each of acetone, N-methylpyrrolidone, 2-propanol, and 2-heptanone at 23° C. for 10 minutes. It was ascertained that each film had a film thickness change of 5% or less between before and after the immersion.

The invention claimed is:

1. A photosensitive resin composition for a microlens, the photosensitive resin composition comprising: a component (A); a component (B); and a component (C), wherein the component (A) is a copolymer selected from the group consisting of a copolymer having structural units selected from the group consisting of

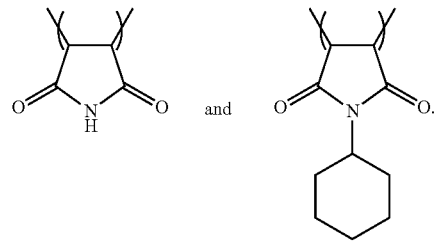

a copolymer having structural units selected from the group consisting of

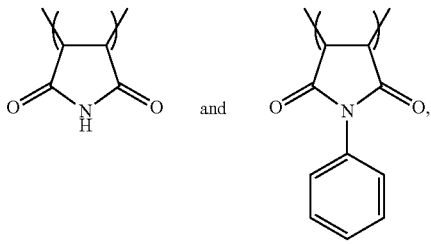 and a copolymer having structural units selected from the group consisting of

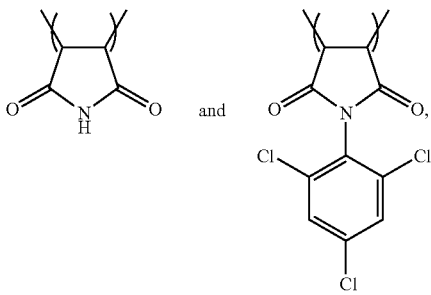 and a copolymer having structural units selected from the group consisting of

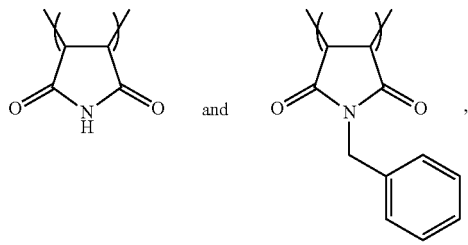, a copolymer having structural units selected from the group consisting of

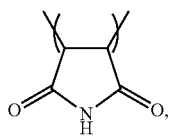, 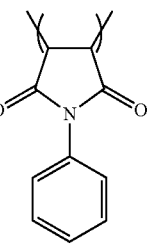 and

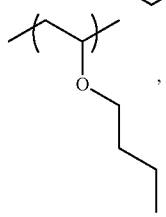, and a copolymer having structural units selected from the group consisting of

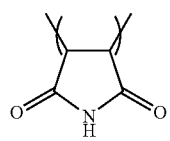 and 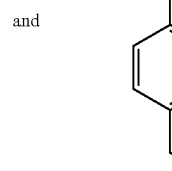, the component (B) is a cross-linking agent, and the component (C) is a photosensitizing agent.

2. The photosensitive resin composition for a microlens according to claim 1, wherein the copolymer has a weight-average molecular weight of 1,000 to 20,000.

3. A cured film obtained from the photosensitive resin composition for a microlens according to claim 1.

4. A microlens produced from the photosensitive resin composition for a microlens according to claim 1.

* * * * *